US012588570B2

(12) United States Patent
Imi et al.

(10) Patent No.: US 12,588,570 B2
(45) Date of Patent: Mar. 24, 2026

(54) SEMICONDUCTOR DEVICE

(71) Applicants: KABUSHIKI KAISHA TOSHIBA, Tokyo (JP); Toshiba Electronic Devices & Storage Corporation, Tokyo (JP)

(72) Inventors: Hitoshi Imi, Yokohama Kanagawa (JP); Yutaka Horie, Mitaka Tokyo (JP); Shugo Suzuki, Hanno Saitama (JP); Yasutomo Sakurai, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 9 days.

(21) Appl. No.: 18/828,516

(22) Filed: Sep. 9, 2024

(65) Prior Publication Data

US 2025/0364509 A1      Nov. 27, 2025

(30) Foreign Application Priority Data

May 21, 2024      (JP) ................................. 2024-082659

(51) Int. Cl.
*H01L 25/16*      (2023.01)
*H01L 23/495*      (2006.01)
(Continued)

(52) U.S. Cl.
CPC ...... *H01L 25/162* (2013.01); *H01L 23/49575* (2013.01); *H03K 17/162* (2013.01);
(Continued)

(58) Field of Classification Search
CPC ............. H01L 25/162; H01L 23/49575; H01L 23/3107; H01L 24/48; H01L 2224/48245;
(Continued)

(56) References Cited

U.S. PATENT DOCUMENTS

| | | | | |
|---|---|---|---|---|
| 11,303,209 B2 * | 4/2022 | Ikeda | .................... | H02M 3/156 |
| 11,367,715 B2 * | 6/2022 | Tonedachi | ........... | H03K 17/785 |
| 11,749,578 B2 * | 9/2023 | Takahashi | ............... | H01L 24/09 |
| | | | | 257/712 |

FOREIGN PATENT DOCUMENTS

| | | |
|---|---|---|
| JP | 2020167748 | 10/2020 |
| JP | 2020167869 | 10/2020 |

(Continued)

*Primary Examiner* — Ryan Jager
(74) *Attorney, Agent, or Firm* — Knobbe, Martens, Olson & Bear, LLP

(57) ABSTRACT

According to one embodiment, a semiconductor device includes: first, second, and third lead frames; a first transistor which is GaN transistor provided on the first lead frame and electrically connected to the first lead frame; a second transistor which is GaN transistor provided on the second lead frame and electrically connected to the third lead frame; a third transistor which is MOS transistor provided on the third lead frame and electrically connected to the third lead frame and the first transistor; a fourth transistor which is MOS transistor provided on the second lead frame and electrically connected to the second lead frame and the second transistor; and a capacitor electrically connected to the first and the second lead frame; wherein the first, the third, the second, and the fourth transistor are arranged side by side in this order in a first direction.

19 Claims, 6 Drawing Sheets

(51) Int. Cl.

| | |
|---|---|
| *H03K 17/16* | (2006.01) |
| *H01L 23/00* | (2006.01) |
| *H01L 23/31* | (2006.01) |
| *H02M 1/08* | (2006.01) |
| *H10D 1/68* | (2025.01) |
| *H10D 30/47* | (2025.01) |
| *H10D 30/60* | (2025.01) |
| *H10D 62/85* | (2025.01) |

(52) U.S. Cl.
CPC .......... *H01L 23/3107* (2013.01); *H01L 24/48* (2013.01); *H01L 2224/48245* (2013.01); *H02M 1/08* (2013.01); *H10D 1/68* (2025.01); *H10D 30/47* (2025.01); *H10D 30/60* (2025.01); *H10D 62/8503* (2025.01)

(58) Field of Classification Search
CPC ......... H03K 17/162; H02M 1/08; H10D 1/68; H10D 30/47; H10D 30/60; H10D 62/8503
USPC ......................................................... 327/109
See application file for complete search history.

(56) References Cited

FOREIGN PATENT DOCUMENTS

| | | |
|---|---|---|
| JP | 2021089971 | 6/2021 |
| JP | 2022115706 | 8/2022 |
| JP | 2023032303 | 3/2023 |
| WO | WO 2019/065173 | 11/2020 |
| WO | WO 2020/170650 | 12/2021 |

* cited by examiner

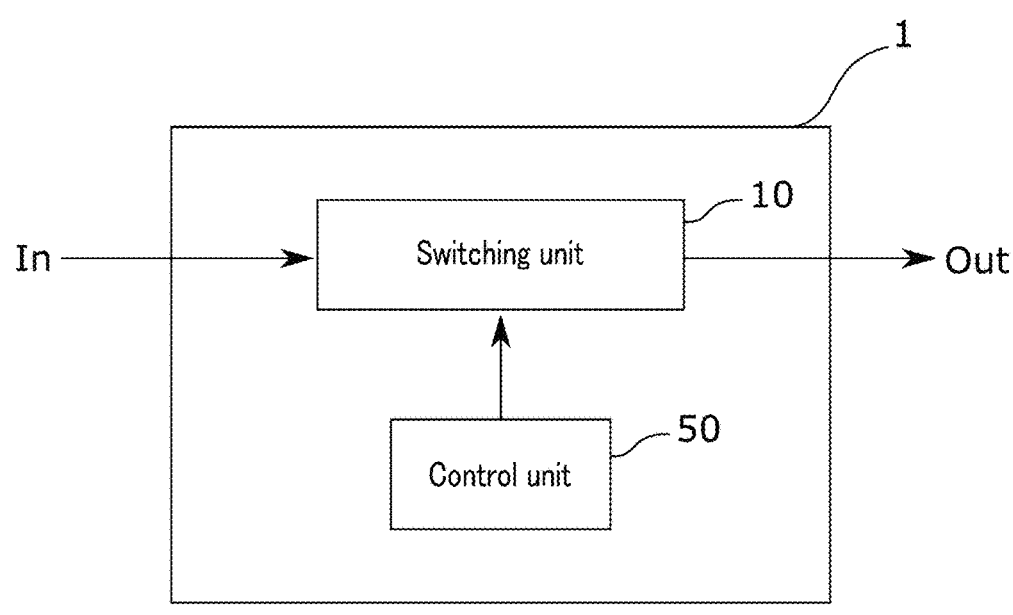
F I G. 1
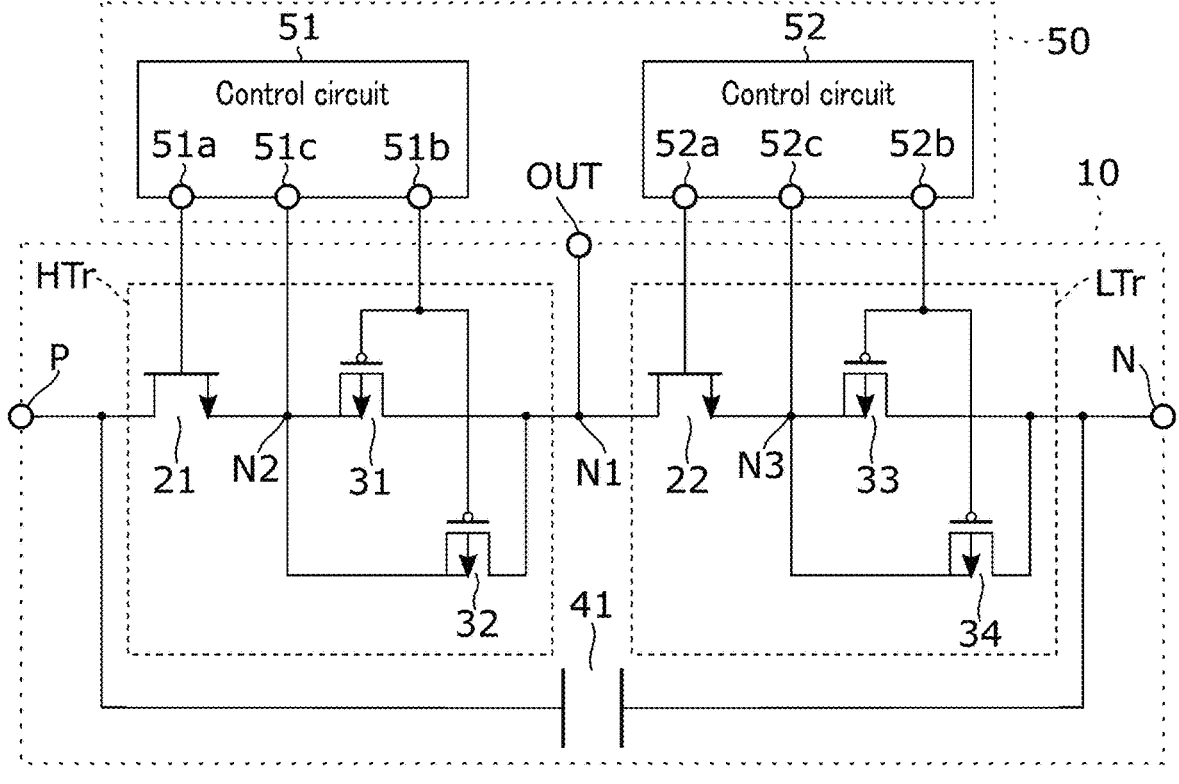
F I G. 2

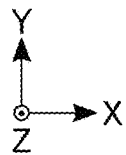
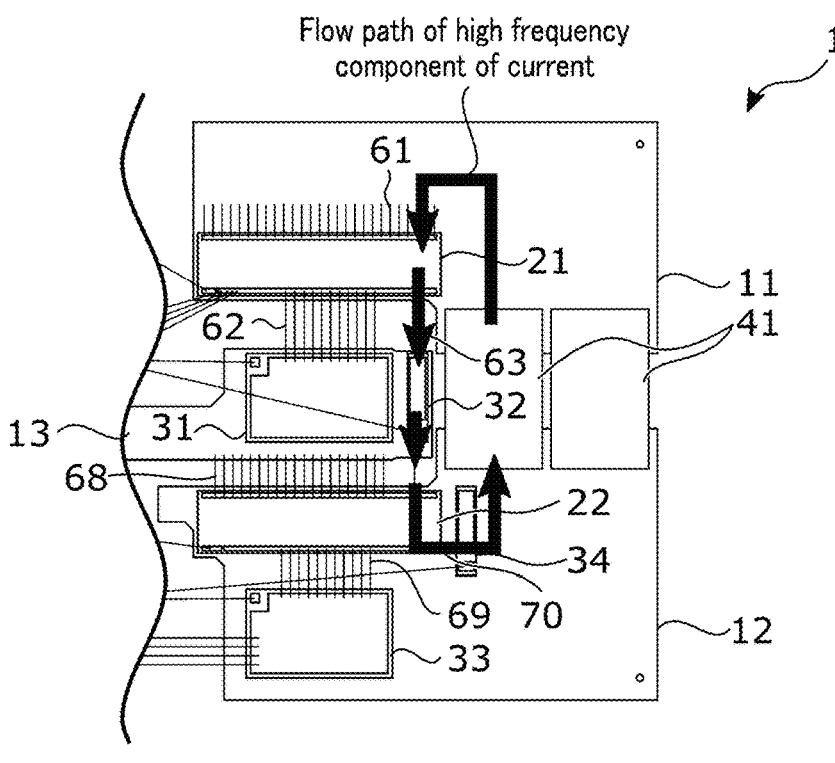
Flow path of high frequency component of current
F I G. 5
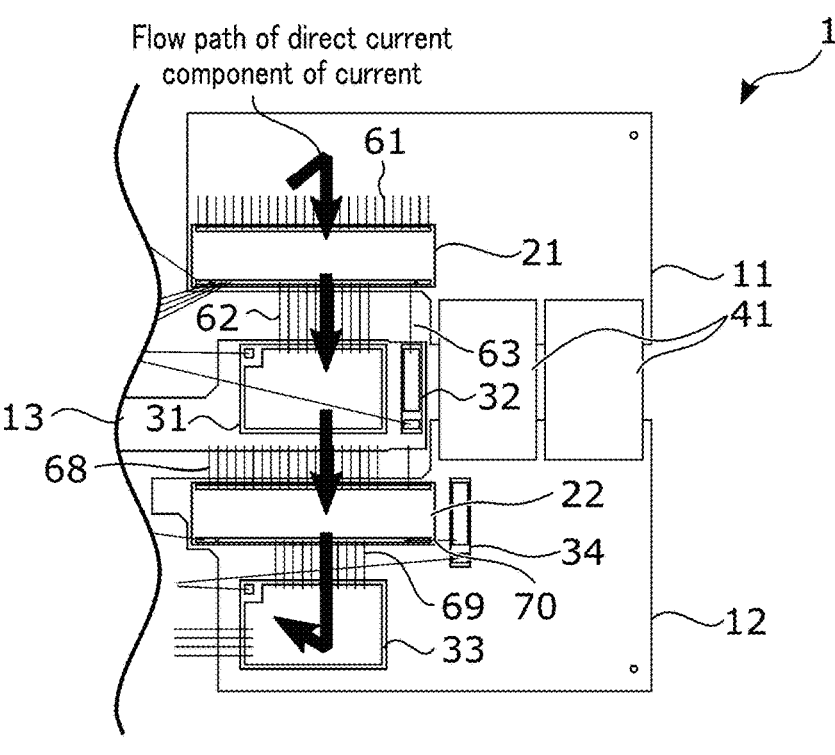
Flow path of direct current component of current
F I G. 6

SEMICONDUCTOR DEVICE

CROSS-REFERENCE TO RELATED APPLICATION

This application is based upon and claims the benefit of priority from Japanese Patent Application No. 2024-082659, filed May 21, 2024, the entire contents of which are incorporated herein by reference.

FIELD

Embodiments described herein relate generally to a semiconductor device.

BACKGROUND

A power semiconductor including a GaN transistor using gallium nitride (GaN) is known. The GaN transistor can perform high-speed switching, and is used in a power conversion apparatus.

BRIEF DESCRIPTION OF DRAWINGS

FIG. 1 is a block diagram illustrating an example of a configuration of a semiconductor device according to an embodiment.

FIG. 2 is a circuit diagram illustrating an example of a circuit configuration of the semiconductor device according to the embodiment.

FIG. 5 is a diagram illustrating a main flow path of a high frequency component of a current in the semiconductor device according to the embodiment.

FIG. 6 is a diagram illustrating a main flow path of a direct current component of the current in the semiconductor device according to the embodiment.

DETAILED DESCRIPTION

Figure 3:
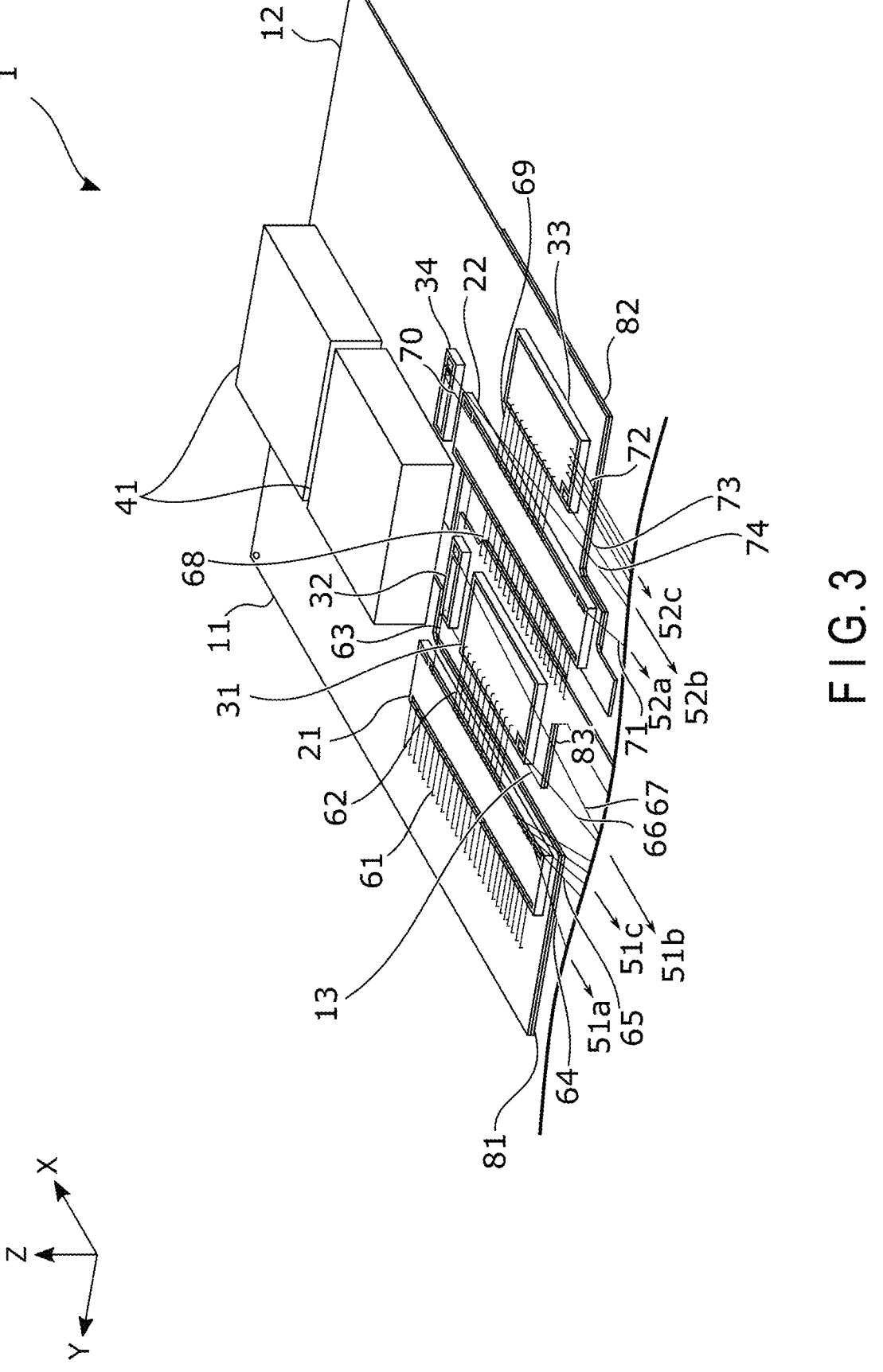
FIG. 3 is a perspective view illustrating an example of an internal structure of the semiconductor device according to the embodiment.

In general, according to one embodiment, a semiconductor device includes: a first lead frame, a second lead frame, and a third lead frame; a first transistor provided on the first lead frame and having a first terminal electrically connected to the first lead frame; a second transistor provided on the second lead frame and having a first terminal electrically connected to the third lead frame; a third transistor provided on the third lead frame and having a first terminal electrically connected to the third lead frame and a second terminal electrically connected to a second terminal of the first transistor; a fourth transistor provided on the second lead frame and having a first terminal electrically connected to the second lead frame and a second terminal electrically connected to a second terminal of the second transistor; a capacitor having a first terminal electrically connected to the first lead frame and a second terminal electrically connected to the second lead frame; and a sealing resin configured to seal the first transistor, the second transistor, the third transistor, the fourth transistor, and the capacitor; wherein the first transistor and the second transistor are GaN transistors, the third transistor and the fourth transistor are MOS transistors, and the first transistor, the third transistor, the second transistor, and the fourth transistor are arranged side by side in this order in a first direction.

Hereinafter, an embodiment will be described with reference to the drawings. In the following description, components having substantially the same function and configuration are denoted by the same reference numerals.

In the following description, a first element is "connected" to a second element includes that the first element is connected to the second element indirectly via an intermediate element that is always or selectively conductive, or directly without an intermediate element.

Hereinafter, a power semiconductor device will be described as an example of a semiconductor device according to the embodiment. The power semiconductor device is applied to, for example, a power conversion apparatus such as an inverter or a converter.

First, a configuration of the semiconductor device according to the embodiment will be described with reference to FIG. 1. FIG. 1 is a block diagram illustrating an example of the configuration of the semiconductor device according to the embodiment.

A semiconductor device 1 includes a configuration in which a plurality of semiconductor chips is integrated into a package. As illustrated in FIG. 1, the semiconductor device 1 includes a switching unit 10 and a control unit 50. The switching unit 10 converts and outputs an input signal by performing switching. For example, an input direct current (DC) is converted into an alternative current (AC) and output. The control unit 50 controls switching operation of the switching unit 10.

Next, a circuit configuration of the semiconductor device according to the embodiment will be described with reference to FIG. 2. FIG. 2 is a circuit diagram illustrating an example of the circuit configuration of the semiconductor device according to the embodiment.

As illustrated in FIG. 2, the switching unit 10 includes terminals P, N, and OUT, a high-side transistor HTr, a low-side transistor LTr, and a capacitor 41. The control unit 50 includes control circuits 51 and 52.

The terminals P and N are input terminals. The terminal P is connected to a positive terminal (P) of an external DC power supply. The terminal N is connected to a negative terminal (N) of the external DC power supply.

The terminal OUT is an output terminal. The semiconductor device 1 outputs a current to an external device through the terminal OUT.

One terminal of the high-side transistor HTr and one terminal of the low-side transistor LTr are connected in series via a node N1. The other terminal of the high-side transistor HTr is connected to the terminal P. The other terminal of the low-side transistor LTr is connected to the terminal N. The terminal OUT is further connected to the node N1. As described above, the high-side transistor HTr and the low-side transistor LTr constitute a half-bridge circuit. The semiconductor device 1 is a package including the half-bridge circuit.

The high-side transistor HTr includes a GaN transistor 21 and MOS transistors 31 and 32. The low-side transistor LTr includes a GaN transistor 22 and MOS transistors 33 and 34.

The GaN transistors 21 and 22 are, for example, gallium nitride-high electron mobility transistors (GaN-HEMTs)

using gallium nitride. The GaN transistors 21 and 22 are normally-on transistors. That is, in a case where a potential difference between a gate and a source is 0 V, a drain terminal and a source terminal are electrically connected.

The MOS transistors 31, 32, 33, and 34 are, for example, metal oxide semiconductor field effect transistors (MOS-FETs) using silicon. The MOS transistors 31, 32, 33, and 34 include P-type MOSFETs. The MOS transistors 31, 32, 33, and 34 are normally-off transistors. That is, in a case where the potential difference between the gate and the source is 0 V, the drain terminal and the source terminal are electrically insulated. The magnitudes of gate threshold voltages of the MOS transistors 31 and 32 are substantially equal. The magnitudes of the gate threshold voltages of the MOS transistors 33 and 34 are substantially equal.

The high-side transistor HTr has a configuration in which the MOS transistors 31 and 32 connected in parallel and the GaN transistor 21 are connected in series via a node N2.

The drain terminal of the GaN transistor 21 is connected to the terminal P. The source terminal of the GaN transistor 21 is connected to the node N2. A gate terminal of the GaN transistor 21 is connected to the control circuit 51.

The drain terminals of the MOS transistors 31 and 32 are connected to the node N1. The source terminals of the MOS transistors 31 and 32 are connected to the node N2. The gate terminals of the MOS transistors 31 and 32 are connected to the control circuit 51.

The low-side transistor LTr has a configuration in which the MOS transistors 33 and 34 connected in parallel and the GaN transistor 22 are connected in series via a node N3.

The drain terminal of the GaN transistor 22 is connected to the node N1. The source terminal of the GaN transistor 22 is connected to the node N3. The gate terminal of the GaN transistor 22 is connected to the control circuit 52.

The drain terminals of the MOS transistors 33 and 34 are connected to the terminal N. The source terminals of the MOS transistors 33 and 34 are connected to the node N3. The gate terminals of the MOS transistors 33 and 34 are connected to the control circuit 52.

The capacitor 41 has a first terminal connected to the terminal P and a second terminal connected to the terminal N. That is, the capacitor 41 is provided in parallel with the configuration in which the high-side transistor HTr and the low-side transistor LTr connected in series via the node N1.

The control circuits 51 and 52 are, for example, gate driver circuits. The control circuit 51 controls driving of the high-side transistor HTr. The control circuit 52 controls driving of the low-side transistor LTr. Note that in the present embodiment, the high-side transistor HTr and the low-side transistor LTr are respectively controlled using different control circuits 51 and 52, but may be controlled using a common control circuit.

The control circuit 51 includes a GaN gate control terminal 51a, a MOS gate control terminal 51b, and a source control terminal 51c. The GaN gate control terminal 51a is connected to the gate terminal of the GaN transistor 21. The GaN gate control terminal 51a controls driving of the GaN transistor 21 according to a magnitude of a gate voltage to be applied. The MOS gate control terminal 51b is connected to the gate terminals of the MOS transistors 31 and 32. The MOS gate control terminal 51b controls driving of the MOS transistors 31 and 32 according to the magnitude of the gate voltage to be applied. Note that the magnitudes of the gate voltages applied to the gate terminals of the MOS transistors 31 and 32 are substantially the same. The source control terminal 51c is connected to the node N2. The source control terminal 51c is, for example, a terminal that determines a reference potential of a voltage applied by the GaN gate control terminal 51a and the MOS gate control terminal 51b.

The control circuit 52 includes a GaN gate control terminal 52a, a MOS gate control terminal 52b, and a source control terminal 52c. The GaN gate control terminal 52a is connected to the gate terminal of the GaN transistor 22. The GaN gate control terminal 52a controls driving of the GaN transistor 22 according to the magnitude of the gate voltage to be applied. The MOS gate control terminal 52b is connected to the gate terminals of the MOS transistors 33 and 34. The MOS gate control terminal 52b controls driving of the MOS transistors 33 and 34 according to the magnitude of the gate voltage to be applied. Note that the magnitudes of the gate voltages applied to the gate terminals of the MOS transistors 33 and 34 are substantially the same. The source control terminal 52c is connected to the node N3. The source control terminal 52c is, for example, a terminal that determines a reference potential of a voltage applied by the GaN gate control terminal 52a and the MOS gate control terminal 52b.

Next, an internal structure of the switching unit in the semiconductor device according to the embodiment will be described with reference to FIGS. 3 and 4.

FIG. 3 is a perspective view illustrating an example of an internal structure of the semiconductor device according to the embodiment. FIG. 4 is a plan view illustrating an example of a planar layout of the semiconductor device according to the embodiment. Note that in FIGS. 3 and 4, the control unit 50 is omitted.

Figure 4:
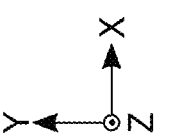
FIG. 4 is a plan view illustrating an example of a planar layout of the semiconductor device according to the embodiment.

As illustrated in FIGS. 3 and 4, the semiconductor device 1 further includes lead frames 11, 12, and 13, wirings 61, 62, 63, 64, 65, 66, 67, 68, 69, 70, 71, 72, 73, and 74, and electrodes 81, 82, and 83.

The lead frames 11, 12, and 13 are plate-shaped conductors and are provided in substantially the same plane. Each of the lead frames 11 and 12 has a substantially L-shape. Specifically, the lead frame 11 includes a first portion 11-1 and a second portion 11-2 extending in directions substantially orthogonal to each other. The lead frame 12 includes a third portion 12-1 and a fourth portion 12-2 extending in directions substantially orthogonal to each other. The lead frames 11 and 12 are arranged to have a substantially U-shape. Specifically, in the lead frames 11 and 12, terminals of the second portion 11-2 and the fourth portion 12-2 face each other and are arranged apart from each other. The lead frame 13 has a substantially rectangular shape. The lead frame 13 is disposed between the first portion 11-1 and the third portion 12-1 and apart from them.

Hereinafter, a plane on which the lead frames 11, 12, and 13 are arranged is referred to as an XY plane. A direction in which the first portion 11-1 and the third portion 12-1 extend is referred to as an X direction. A direction in which the second portion 11-2 and the fourth portion 12-2 extend is referred to as a Y direction. A direction intersecting the XY plane and in which the GaN transistors 21 and 22, the MOS transistors 31, 32, 33, and 34, and the capacitor 41 are provided as viewed from the lead frames 11, 12, and 13 is referred to as a Z direction or an upward direction. A direction opposite to the Z direction is referred to as a downward direction.

The capacitor 41 is, for example, a chip type multi-layer ceramic capacitor (MLCC). The capacitor 41 is provided across the second portion 11-2 and the fourth portion 12-2 in the Y direction. The first terminal of the capacitor 41 is connected to an upper surface of the second portion 11-2. The second terminal of the capacitor 41 is connected to an upper surface of the fourth portion 12-2. Note that in the examples of FIGS. 3 and 4, two capacitors 41 are provided, but one or more capacitors 41 may be provided.

The GaN transistor 21 has, for example, a rectangular shape. The GaN transistor 21 is provided on a surface of the first portion 11-1 such that its longitudinal direction is in the X direction. The GaN transistor 21 includes electrodes corresponding to the drain terminal, the source terminal, and the gate terminal, for example, on its upper surface. The electrode corresponding to the source terminal of the GaN transistor 21 is provided, for example, on the upper surface of the GaN transistor 21 so as to extend along a long side on the lead frame 13 side. The electrode corresponding to the drain terminal of the GaN transistor 21 is provided, for example, on the upper surface of the GaN transistor 21 so as to extend along another long side opposite to the source terminal.

The GaN transistor 22 has, for example, a rectangular shape. The GaN transistor 22 is provided on a surface of the third portion 12-1 such that its longitudinal direction is in the X direction. The GaN transistor 22 includes electrodes corresponding to the drain terminal, the source terminal, and the gate terminal, for example, on its upper surface. The electrode corresponding to the drain terminal of the GaN transistor 22 is provided, for example, on the upper surface of the GaN transistor 22 so as to extend along the long side on the lead frame 13 side. The electrode corresponding to the source terminal of the GaN transistor 22 is provided, for example, on the upper surface of the GaN transistor 22 so as to extend along another long side opposite to the drain terminal. The GaN transistors 21 and 22 are, for example, arranged such that centers of the respective drain terminals in the X direction are aligned on the same straight line in the Y direction.

The MOS transistor 31 has, for example, a rectangular shape. A length of the MOS transistor 31 in its longitudinal direction is, for example, shorter than that of the GaN transistors 21 and 22 in the longitudinal direction. The MOS transistor 31 is provided on an upper surface of the lead frame 13 such that the longitudinal direction is in the X direction and it is sandwiched between the GaN transistors 21 and 22 in the Y direction. The MOS transistor 31 has, for example, an electrode corresponding to the drain terminal on its lower surface, and electrodes corresponding to the source terminal and the gate terminal on its upper surface. The drain terminal of the MOS transistor 31 is connected to the lead frame 13.

The MOS transistor 32 has, for example, a rectangular shape. A length of the MOS transistor 32 in its longitudinal direction is, for example, substantially equal to a length of the MOS transistor 31 in its short direction. The MOS transistor 32 is provided on the upper surface of the lead frame 13 such that its longitudinal direction is in the Y direction and it is sandwiched between the GaN transistors 21 and 22 in the Y direction, and is sandwiched between the MOS transistor 31 and the capacitor 41 in the X direction. The MOS transistor 32 has, for example, an electrode corresponding to the drain terminal on its lower surface, and electrodes corresponding to the source terminal and the gate terminal on its upper surface. The drain terminal of the MOS transistor 32 is connected to the lead frame 13.

The MOS transistor 33 has, for example, a rectangular shape. A length of the MOS transistor 33 in its longitudinal direction is, for example, shorter than that of the GaN transistors 21 and 22 in the longitudinal direction. The MOS transistor 33 is provided on the upper surface of the third portion 12-1 so as to sandwich the GaN transistor 22 in the Y direction with the MOS transistor 31. That is, the GaN transistor 21, the MOS transistor 31, the GaN transistor 22, and the MOS transistor 33 are linearly arranged in the Y direction in this order. The MOS transistor 33 has, for example, an electrode corresponding to the drain terminal on its lower surface, and electrodes corresponding to the source terminal and the gate terminal on its upper surface. The drain terminal of the MOS transistor 33 is connected to the third portion 12-1.

The MOS transistor 34 has, for example, a rectangular shape. A length of the MOS transistor 34 in its longitudinal direction is, for example, substantially equal to a length of the MOS transistor 33 in its short direction. The MOS transistor 34 is provided on the upper surface of the fourth portion 12-2 such that its longitudinal direction is in the Y direction, and it is aligned with the GaN transistor 22 in the X direction, and is aligned with the capacitor 41 in the Y direction. The MOS transistor 34 has, for example, an electrode corresponding to the drain terminal on its lower surface, and electrodes corresponding to the source terminal and the gate terminal on its upper surface. The drain terminal of the MOS transistor 34 is connected to the fourth portion 12-2.

The wiring 61 includes, for example, a plurality of bonding wires. Each of the plurality of bonding wires included in the wiring 61 extends in the Y direction such that a first terminal is in contact with the first portion 11-1 and a second terminal is in contact with the drain terminal of the GaN transistor 21, to connect the two. The second terminals of the plurality of bonding wires included in the wiring 61 are provided near a center of the electrode corresponding to the drain terminal of the GaN transistor 21 so as not to be biased in the X direction.

The wiring 62 includes, for example, the plurality of bonding wires. Each of the plurality of bonding wires included in the wiring 62 extends in the Y direction such that a first terminal is in contact with the source terminal of the GaN transistor 21 and a second terminal is in contact with the source terminal of the MOS transistor 31, to connect the two. The first terminals of the plurality of bonding wires included in the wiring 62 are provided near a center of the electrode corresponding to the source terminal of the GaN transistor 21 so as not to be biased in the X direction as much as possible.

The wiring 63 includes, for example, the bonding wire. The wiring 63 extends in the Y direction such that a first terminal is in contact with the source terminal of the GaN transistor 21 and a second terminal is in contact with the source terminal of the MOS transistor 32, to connect the two.

The wiring 64 includes, for example, the bonding wire. The wiring 64 has a first terminal in contact with the gate terminal of the GaN transistor 21 and a second terminal in contact with the GaN gate control terminal 51a of the control circuit 51, to connect the two.

The wiring 65 includes, for example, the plurality of bonding wires. Each of the plurality of bonding wires included in the wiring 65 has a first terminal in contact with the source terminal of the GaN transistor 21 and a second terminal in contact with the source control terminal 51c of the control circuit 51, to connect the two. Note that the first terminal of each of the plurality of bonding wires included in the wiring 65 may be in contact with the source terminal of the MOS transistor 31 instead of the source terminal of the GaN transistor 21.

The wiring 66 includes, for example, the bonding wire. The wiring 66 has a first terminal in contact with the gate terminal of the MOS transistor 31 and a second terminal in contact with the MOS gate control terminal 51*b* of the control circuit 51, to connect the two.

The wiring 67 includes, for example, the bonding wire. The wiring 67 has a first terminal in contact with the gate terminal of the MOS transistor 32 and a second terminal in contact with the MOS gate control terminal 51*b* of the control circuit 51, to connect the two. Note that the second terminal of the wiring 67 may be in contact with the gate terminal of the MOS transistor 31 instead of the MOS gate control terminal 51*b* of the control circuit 51.

The wiring 68 includes, for example, the plurality of bonding wires. Each of the plurality of bonding wires included in the wiring 68 extends in the Y direction such that a first terminal is in contact with the lead frame 13 and a second terminal is in contact with the drain terminal of the GaN transistor 22, to connect the two. For example, one or a few of the plurality of bonding wires included in the wiring 68 is provided so as to be sandwiched between the GaN transistor 22 and the MOS transistor 32 in the Y direction. The second terminals of the plurality of bonding wires included in the wiring 68 are provided near a center of the electrode corresponding to the drain terminal of the GaN transistor 22 so as not to be biased in the X direction as much as possible, except for the one bonding wire provided so as to be sandwiched between the GaN transistor 22 and the MOS transistor 32 in the Y direction.

The wiring 69 includes, for example, the plurality of bonding wires. Each of the plurality of bonding wires included in the wiring 69 extends in the Y direction such that a first terminal is in contact with the source terminal of the GaN transistor 22 and a second terminal is in contact with the source terminal of the MOS transistor 33, to connect the two. The first terminals of the plurality of bonding wires included in the wiring 69 are provided near a center of the electrode corresponding to the source terminal of the GaN transistor 22 so as not to be biased in the X direction as much as possible.

The wiring 70 is, for example, the bonding wire. The wiring 70 extends in the X direction such that a first terminal is in contact with the source terminal of the GaN transistor 22 and a second terminal is in contact with the source terminal of the MOS transistor 34, to connect the two.

The wiring 71 includes, for example, the bonding wire. The wiring 71 has a first terminal in contact with the gate terminal of the GaN transistor 22 and a second terminal in contact with the GaN gate control terminal 52*a* of the control circuit 52, to connect the two.

The wiring 72 includes, for example, the plurality of bonding wires. Each of the plurality of bonding wires included in the wiring 72 has a first terminal in contact with the source terminal of the MOS transistor 33 and a second terminal in contact with the source control terminal 52*c* of the control circuit 52, to connect the two. Note that the first terminal of each of the plurality of bonding wires included in the wiring 72 may be in contact with the source terminal of the GaN transistor 22 instead of the source terminal of the MOS transistor 33.

The wiring 73 includes, for example, the bonding wire. The wiring 73 has a first terminal in contact with the gate terminal of the MOS transistor 33 and a second terminal in contact with the MOS gate control terminal 52*b* of the control circuit 52, to connect the two.

The wiring 74 includes, for example, the bonding wire. The wiring 74 has a first terminal in contact with the gate terminal of the MOS transistor 34 and a second terminal in contact with the MOS gate control terminal 52*b* of the control circuit 52, to connect the two. Note that the second terminal of the wiring 74 may be in contact with the gate terminal of the MOS transistor 33 instead of the MOS gate control terminal 52*b* of the control circuit 52.

Note that each of the wirings 61, 62, 63, 68, 69, and 70 is desirably provided to have a substantially shortest distance from the viewpoint of suppressing ringing to be described later.

The electrodes 81, 82, and 83 are plate-shaped conductors provided on a lower surface of the semiconductor device 1. The electrodes 81, 82, and 83 function as terminals for electrically connecting a device outside the semiconductor device 1 and an internal circuit configuration.

The electrode 81 is provided in contact with a lower surface of the lead frame 11. The electrode 81 is connected to a positive electrode of an external DC power supply. That is, the electrode 81 has a function of the terminal P.

The electrode 82 is provided in contact with a lower surface of the lead frame 12. The electrode 82 is connected to a negative electrode of the external DC power supply. That is, the electrode 82 has a function of the terminal N.

The electrode 83 is provided in contact with a lower surface of the lead frame 13. The electrode 83 functions as an output terminal, and a current is output from the semiconductor device 1 to the external device via the electrode 83. That is, the electrode 83 has a function of the terminal OUT.

Note that the semiconductor device 1 has a housing structure sealed with a sealing resin (not illustrated). The sealing resin seals the switching unit 10 and the control unit 50, and insulates unconnected conductors in the semiconductor device 1. In addition, the sealing resin protects the components of the semiconductor device 1 from physical disturbance.

With the configuration according to the embodiment, the half-bridge circuit and the capacitor 41 can be integrated into a package. Accordingly, it is possible to shorten a path of a current flowing in a ring shape through the half-bridge circuit and the capacitor 41 at the time of switching. Therefore, noise associated with occurrence of the ringing at the time of switching can be suppressed. This will be described in detail below.

The power semiconductor using the GaN transistor is characterized by being capable of high-speed switching as compared with a transistor using silicon (Si). Therefore, since switching frequency increases and an inductor for inductance correction is unnecessary, miniaturization and high efficiency of the package can be achieved.

On the other hand, since switching speed is high, the ringing is likely to occur at the time of switching. The ringing serves as a noise source, and the noise may be superimposed on an output signal. The noise is undesirable because it degrades quality of the signal to be transmitted and increases a possibility of outputting unintended signals and a possibility of damaging peripheral components.

In the power semiconductor using the GaN transistor and the MOS transistor, a high frequency component of the current is supplied from a terminal on a high voltage side of the capacitor in order to charge an output capacitance of the GaN transistor in a case where the GaN transistor performs switching. The high frequency component of the current passes through the GaN transistor and the MOS transistor, and flows through a path returning to the terminal on a low-voltage side of the capacitor. In a case where inductance in the path through which the high frequency component of the current flows (hereinafter, referred to as loop inductance)

is large, the ringing due to high-speed switching of the GaN transistor occurs, and the noise is superimposed on the output signal.

A measure for suppressing the noise is to reduce the loop inductance. In a case where the loop inductance decreases, the ringing can be suppressed, and generation of the noise can be suppressed. Since it is known that the inductance increases in proportion to a path length of the current, the loop inductance can be reduced by shortening the path through which the high frequency component of the current flows.

On the other hand, in a case where a distance between each transistor and the capacitor is simply shortened, a flow path of a direct current component of the current flowing through the GaN transistor may be uneven, and a portion where the current is concentrated may occur. In a case where the current is concentrated, local heat generation occurs, and reliability of the chip and the wire may deteriorate.

In the case of the configuration according to the embodiment, the half-bridge circuit and the capacitor 41 are integrated into the package. With this configuration, terminals and wirings for connecting the individual packages are unnecessary, and the current path can be reduced accordingly, so that the loop inductance can be reduced and the generation of the noise can be suppressed.

Furthermore, in the case of the configuration according to the embodiment, two MOS transistors are connected in parallel to each GaN transistor. With this configuration, main flow paths of the high frequency component and the direct current component of the current can be divided separately. This will be described with reference to FIGS. 5 and 6.

FIG. 5 is a diagram illustrating the main flow path of the high frequency component of the current in the semiconductor device according to the embodiment. FIG. 6 is a diagram illustrating the main flow path of the direct current component of the current in the semiconductor device according to the embodiment. In FIGS. 5 and 6, the main flow path of each current is indicated by arrows on the planar layout of the semiconductor device illustrated in FIG. 4.

The high frequency component of the current flows through a flow path in which the loop inductance is smaller. That is, a loop that forms a shortest path is the flow path of the high frequency component of the current. Therefore, as illustrated in FIG. 5, the high frequency component of the current mainly flows from the first terminal of the capacitor 41 to the second terminal of the capacitor 41 through the lead frame 11, the wiring 61, the GaN transistor 21, the wiring 63, the MOS transistor 32, the lead frame 13, the wiring 68, the GaN transistor 22, the wiring 70, the MOS transistor 34, and the lead frame 12 in this order. Note that in a case where the wirings 61 and 68 include the plurality of bonding wires, a bonding wire having a shortest flow path, namely, a bonding wire provided at a position closest to the capacitor 41 is passed through.

On the other hand, as illustrated in FIG. 6, the direct current component of the current mainly flows from the electrode 81 in contact with the lower surface of the lead frame 11 to the electrode 82 in contact with the lower surface of the lead frame 12 through the lead frame 11, the wiring 61, the GaN transistor 21, the wiring 62, the MOS transistor 31, the lead frame 13, the wiring 68, the GaN transistor 22, the wiring 69, the MOS transistor 33, and the lead frame 12 in this order.

By dividing the main flow path of the high frequency component and the direct current component of the current, the flow path of the high frequency component of the current can be shortened. Therefore, the loop inductance can be reduced, and the noise can be suppressed. Further, in the flow path of the direct current component of the current, the GaN transistors 21 and 22 and the MOS transistors 31 and 33 are aligned on a straight line, and the wirings connecting the transistors are arranged near the center of the electrode corresponding to either the drain terminal or the source terminal so as not to be biased in the X direction. Therefore, it is possible to cause the current to flow substantially uniformly through the GaN transistors 21 and 22 and the MOS transistors 31 and 33, and to suppress deterioration in reliability due to current concentration.

The semiconductor device according to the embodiment described above can be variously modified.

Figure 7:
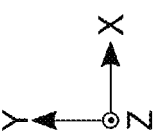
FIG. 7 is a plan view illustrating an example of the planar layout of the semiconductor device according to a first modification of the embodiment.

FIG. 7 is a plan view illustrating an example of the planar layout of the semiconductor device according to a first modification of the embodiment. Note that in FIG. 7, the control unit 50 and the sealing resin are omitted.

In the first modification illustrated in FIG. 7, the MOS transistor 32 and the wirings 63 and 67 are not included. Instead of the MOS transistor 31, a MOS transistor 31A is included. The MOS transistor 31A has a structure in which the longitudinal direction is longer than that of the MOS transistor 31. Arrangement and connection relationship of the MOS transistor 31A are the same as the arrangement and connection relationship of the MOS transistor 31 in the original embodiment.

The MOS transistor 31A is provided to extend in the X direction up to a region where the MOS transistor 32 is disposed in the original embodiment. Therefore, the MOS transistor 31A can complement an effect of the MOS transistor 32 that is the flow path of the high frequency component of the current in the original embodiment. That is, the high frequency component of the current mainly flows from the first terminal of the capacitor 41 to the second terminal of the capacitor 41 through the lead frame 11, the wiring 61, the GaN transistor 21, the wiring 62, the MOS transistor 31A, the lead frame 13, the wiring 68, the GaN transistor 22, the wiring 70, the MOS transistor 34, and the lead frame 12 in this order. Note that in a case where the wirings 61, 62, and 68 include the plurality of bonding wires, the bonding wire having the shortest flow path, namely, the bonding wire provided at the position closest to the capacitor 41 is passed through.

With the configuration according to the first modification, as in the embodiment, the flow path of the high frequency component of the current can be shortened. Therefore, the loop inductance can be reduced, and the noise can be suppressed.

Figure 8:
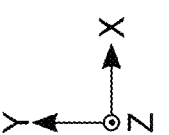
FIG. 8 is a plan view illustrating an example of the planar layout of the semiconductor device according to a second modification of the embodiment.

FIG. 8 is a plan view illustrating an example of the planar layout of the semiconductor device according to a second modification of the embodiment. Note that in FIG. 8, the control unit 50 and the sealing resin are omitted.

In the second modification illustrated in FIG. 8, a wiring 61B is included instead of the bonding wire provided at the position closest to the capacitor 41 among the plurality of bonding wires included in the wiring 61. The wiring 61B includes, for example, the bonding wire. The wiring 61B has a first terminal in contact with the second portion 11-2 and a second terminal in contact with the drain terminal of the GaN transistor 21, and extends from the drain terminal of the GaN transistor 21 toward the capacitor 41.

The wiring 61B is a flow path in a case where the high frequency component of the current mainly output from the first terminal of the capacitor 41 is input to the drain terminal of the GaN transistor 21.

With the configuration according to the second modification, the flow path of the high frequency component of the current can be shortened. Therefore, the loop inductance can be reduced, and the noise can be suppressed.

In addition to the modifications described above, various modifications are conceivable. For example, some or all of the bonding wires included in the wirings 61 to 74 may be replaced with clip connectors.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first lead frame, a second lead frame, and a third lead frame;
a first transistor provided on the first lead frame and having a first terminal electrically connected to the first lead frame;
a second transistor provided on the second lead frame and having a first terminal electrically connected to the third lead frame;
a third transistor provided on the third lead frame and having a first terminal electrically connected to the third lead frame and a second terminal electrically connected to a second terminal of the first transistor;
a fourth transistor provided on the second lead frame and having a first terminal electrically connected to the second lead frame and a second terminal electrically connected to a second terminal of the second transistor;
a capacitor having a first terminal electrically connected to the first lead frame and a second terminal electrically connected to the second lead frame; and
a sealing resin configured to seal the first transistor, the second transistor, the third transistor, the fourth transistor, and the capacitor; wherein
the first transistor and the second transistor are GaN transistors, the third transistor and the fourth transistor are MOS transistors, and
the first transistor, the third transistor, the second transistor, and the fourth transistor are arranged side by side in this order in a first direction.

2. The semiconductor device according to claim 1, wherein
the first transistor and the second transistor are GaN-HEMTs.

3. The semiconductor device according to claim 1, wherein
the first transistor and the second transistor are normally-on transistors.

4. The semiconductor device according to claim 1, wherein
the third transistor and the fourth transistor are MOS-FETS.

5. The semiconductor device according to claim 1, wherein
the third transistor and the fourth transistor are normally-off transistors.

6. The semiconductor device according to claim 1, wherein the first lead frame and the first terminal of the first transistor are connected via a plurality of bonding wires,
the bonding wires include a first wire and a second wire extending in a direction different from a direction of the first wire, and
the second wire connects the first terminal of the first transistor and the first terminal of the capacitor with a shorter distance than the first wire.

7. The semiconductor device according to claim 1, further comprising
a control circuit configured to control driving of the first transistor, the second transistor, the third transistor, and the fourth transistor, wherein
the control circuit is sealed with the sealing resin.

8. The semiconductor device according to claim 1, further comprising
a fifth transistor provided on the second lead frame and having a first terminal electrically connected to the second lead frame, a second terminal electrically connected to the second terminal of the second transistor, and a gate terminal electrically connected to a gate terminal of the fourth transistor, wherein
the capacitor is provided side by side with the third transistor in a second direction intersecting the first direction, on the first lead frame and the second lead frame, and
the fifth transistor is provided side by side in the second direction on the capacitor side with the second transistor.

9. The semiconductor device according to claim 8, wherein
the fifth transistor is a MOSFET.

10. The semiconductor device according to claim 8, wherein
the fifth transistor is a normally-off transistor.

11. The semiconductor device according to claim 8, wherein
a threshold voltage of the fifth transistor is substantially the same as a threshold voltage of the fourth transistor.

12. The semiconductor device according to claim 8, wherein
the first lead frame and the first terminal of the first transistor are connected via a plurality of bonding wires,
the bonding wires include a first wire and a second wire extending in a direction different from a direction of the first wire, and
the second wire connects the first terminal of the first transistor and the first terminal of the capacitor with a shorter distance than the first wire.

13. The semiconductor device according to claim 8, further comprising
a control circuit configured to control driving of the first transistor, the second transistor, the third transistor, the fourth transistor, and the fifth transistor, wherein
the control circuit is sealed with the sealing resin.

14. The semiconductor device according to claim 8, further comprising
a sixth transistor provided on the third lead frame and having a first terminal electrically connected to the third lead frame, a second terminal electrically connected to the second terminal of the first transistor, and a gate terminal electrically connected to a gate terminal of the third transistor, wherein the sixth transistor is provided so as to be sandwiched between the third transistor and the capacitor in the second direction.

15. The semiconductor device according to claim 14, wherein the sixth transistor is a MOSFET.

16. The semiconductor device according to claim 14, wherein the sixth transistor is a normally-off transistor.

17. The semiconductor device according to claim 14, wherein a threshold voltage of the sixth transistor is substantially the same as a threshold voltage of the third transistor.

18. The semiconductor device according to claim 14, wherein the first lead frame and the first terminal of the first transistor are connected via a plurality of bonding wires, the bonding wires include a first wire and a second wire extending in a direction different from a direction of the first wire, and the second wire connects the first terminal of the first transistor and the first terminal of the capacitor with a shorter distance than the first wire.

19. The semiconductor device according to claim 14, further comprising a control circuit configured to control driving of the first transistor, the second transistor, the third transistor, the fourth transistor, the fifth transistor, and the sixth transistor, wherein the control circuit is sealed with the sealing resin.

\* \* \* \* \*